United States Patent
Lee et al.

(10) Patent No.: US 9,214,624 B2
(45) Date of Patent: Dec. 15, 2015

(54) AMORPHOUS SPACERLATTICE SPACER FOR PERPENDICULAR MTJS

(71) Applicant: QUALCOMM Incorporated, San Diego, CA (US)

(72) Inventors: Kangho Lee, San Diego, CA (US); Wei-Chuan Chen, Taipei (TW); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/770,526

(22) Filed: Feb. 19, 2013

(65) Prior Publication Data

US 2014/0027869 A1    Jan. 30, 2014

Related U.S. Application Data

(60) Provisional application No. 61/676,487, filed on Jul. 27, 2012.

(51) Int. Cl.
| | |
|---|---|
| *H01L 43/08* | (2006.01) |
| *H01L 43/02* | (2006.01) |
| *H01L 43/12* | (2006.01) |
| *G11C 11/15* | (2006.01) |
| *G11C 11/16* | (2006.01) |

(52) U.S. Cl.
CPC ............. *H01L 43/02* (2013.01); *G11C 11/15* (2013.01); *H01L 43/08* (2013.01); *H01L 43/12* (2013.01); *G11C 11/16* (2013.01)

(58) Field of Classification Search
CPC ..... H01L 29/82; H01L 27/222; H01L 27/228; H01L 43/08; H01L 43/12
USPC .......................................... 257/421
See application file for complete search history.

(56) References Cited

U.S. PATENT DOCUMENTS

| | | | |
|---|---|---|---|
| 2003/0073251 A1* | 4/2003 | Ning | 438/3 |
| 2003/0180577 A1* | 9/2003 | Do et al. | 428/694 TM |
| 2004/0180237 A1* | 9/2004 | Drewes | 428/692 |
| 2008/0239591 A1 | 10/2008 | Fuji et al. | |
| 2009/0079018 A1* | 3/2009 | Nagase et al. | 257/421 |
| 2011/0149647 A1 | 6/2011 | Kim et al. | |
| 2011/0233696 A1 | 9/2011 | Li | |
| 2012/0012952 A1 | 1/2012 | Chen et al. | |
| 2012/0068284 A1* | 3/2012 | Kitagawa et al. | 257/421 |
| 2012/0104522 A1 | 5/2012 | Jung et al. | |
| 2012/0146167 A1 | 6/2012 | Huai et al. | |
| 2013/0005051 A1* | 1/2013 | Hu et al. | 438/3 |

OTHER PUBLICATIONS

S. Ikeda, K. et al., "A perpendicular-anisotropy CoFeB—MgO magnetic tunnel junction," Nature Materials vol. 9, pp. 721-724, Jul. 11, 2010.*
International Search Report and Written Opinion—PCT/US2013/052383—ISAEPO—Jan. 7, 2014.

* cited by examiner

*Primary Examiner* — Marc Armand
*Assistant Examiner* — Christina Sylvia
(74) *Attorney, Agent, or Firm* — Sam Talpalatsky; Elaine H. Lo

(57) ABSTRACT

A perpendicular magnetic tunnel junction (MTJ) apparatus includes a tunnel magnetoresistance (TMR) enhancement buffer layer deposited between the tunnel barrier layer and the reference layers An amorphous alloy spacer is deposited between the TMR enhancement buffer layer and the reference layers to enhance TMR The amorphous alloy spacer blocks template effects of face centered cubic (fcc) oriented pinned layers and provides strong coupling between the pinned layers and the TMR enhancement buffer layer to ensure full perpendicular magnetization.

10 Claims, 7 Drawing Sheets

AMORPHOUS SPACERLATTICE SPACER FOR PERPENDICULAR MTJS

CROSS REFERENCE TO RELATED APPLICATION

The present application claims the benefit of U.S. Provisional Patent Application No. 61/676,487 to Lee et al. filed on Jul. 27, 2012, the disclosure of which is expressly incorporated by reference herein in its entirety.

TECHNICAL FIELD

The present disclosure generally relates to magnetic tunnel junction (MTJ) devices. More specifically, the present disclosure relates to improving tunnel magneto-resistance (TMR) and thermal stability in perpendicular magnetic random access memory (MRAM) devices.

BACKGROUND

Unlike conventional random access memory (RAM) chip technologies, in magnetic RAM (MRAM) data is not stored as electric charge, but is instead stored by magnetization of storage elements. The basic structure of storage elements consists of metallic ferromagnetic layers separated by a thin tunneling barrier. Typically, ferromagnetic layers underneath the barrier, which are referred to as the pinned layer, have a magnetization that is fixed in a particular direction. The ferromagnetic magnetic layers above the tunneling barrier, which are referred to as the free layer, have a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM, The two different resistances represent a logic "0" and a logic "1" value stored by the MTJ.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

SUMMARY

According to one aspect of the present disclosure, a perpendicular magnetic tunnel junction (MTJ) apparatus includes a tunnel barrier layer deposited between a free layer and a reference layer. The MTJ also includes a tunnel magnetoresistance (TMR) enhancement buffer layer deposited between the tunnel barrier layer and the reference layer, and an amorphous alloy TMR enhancement spacer deposited between the TMR enhancement buffer layer and the reference layer.

According to another aspect of the present disclosure, a method for constructing a perpendicular magnetic tunnel junction (MTJ) apparatus includes depositing a tunnel barrier layer between a free layer and a reference layer, depositing a tunnel magnetoresistance (TMR) enhancement buffer layer between the tunnel barrier layer and the reference layer, and depositing an amorphous alloy TMR enhancement spacer between the TMR enhancement buffer layer and the reference layer.

According to another aspect of the present disclosure, a perpendicular magnetic tunnel junction (MTJ) apparatus includes a tunnel barrier layer deposited between a bottom free layer and a reference layer. The apparatus also has an amorphous alloy perpendicular magnetic anisotropy (PMA) enhancement spacer deposited on the bottom free layer, and a top free layer deposited on the PMA enhancement spacer.

Another aspect of the present disclosure a method for constructing a perpendicular magnetic tunnel junction (MTJ) apparatus includes depositing a tunnel barrier layer between a bottom free layer and a reference layer. The method also includes depositing an amorphous alloy perpendicular magnetic anisotropy (PMA) enhancement spacer on the bottom free layer; and depositing a top free layer on the PMA enhancement spacer.

A perpendicular magnetic tunnel junction (MTJ) apparatus according to another aspect of the present disclosure includes means for increasing exchange coupling to a TMR enhancement buffer layer. The apparatus also has means for increasing surface anisotropy between a top free layer and a bottom free layer.

A method for constructing a perpendicular magnetic tunnel junction (MTJ) apparatus according to one aspect of the present disclosure includes the step of depositing a tunnel barrier layer between a free layer and a reference layer. The method also includes the steps of depositing a tunnel magnetoresistance (TMR) enhancement buffer layer between the tunnel barrier layer and the reference layer, and depositing an amorphous alloy TMR enhancement spacer between the TMR enhancement buffer layer and the reference layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

In one category of MRAM cells, a direction of magnetization of the free layer and the reference layer of a magnetic tunnel junction (MTJ) is parallel to the plane of the respective layer. Such memory cells are referred to as having in-plane magnetic anisotropy. The direction of magnetization of MRAM cells with in-plane magnetic anisotropy is provided by constructing memory cells with an elongated shape, such as an ellipse. Such shape anisotropy forces magnetization to reside along the long-axis of an elliptical MTJ cell because those two states are energetically favorable in the absence of external excitations.

In another category of MRAM cells, the direction of magnetization of the free layer and reference layer of an MTJ is perpendicular to the plane of the respective layer. Such memory cells are referred to as having perpendicular magnetic anisotropy (PMA).

One challenge to the development of perpendicular MTJs is presented by a tendency of magnetic moments in thin films to reside in the film plane. This tendency, which results from demagnetizing fields in thin-film geometry, can be overcome by introducing a strong perpendicular magnetic anisotropy. One way to introduce a strong perpendicular magnetic anisotropy is to use a material that exhibits very strong crystalline anisotropy and has a net magnetic moment that is perpendicular to the plane of the thin film layer. However when introducing such materials into MgO-based MTJs, it is not trivial to achieve high TMR because their crystal structures are not desirable for inducing (001)-texture in MgO. Strong (001)-texture in MgO enables high TMR. For instance, Co-based multilayers, which are one of the promising candidates for perpendicular MET films, typically exhibit fcc-(111).

CoFeB is a material that has been used for in-plane type MRAM cells, CoFeB is typically crystallized into bcc(001), which in turn, promotes the (001)-texture in MgO, resulting in high TMR. While relatively thick CoFeB typically show in-plane magnetization due to strong demagnetizing fields, thin CoFeB can be magnetized perpendicular to the plane. This has been known to originate from surface anisotropy arising from the CoFeB—MgO interface. When surface anisotropy overcomes demagnetizing fields, the thin CoFeB layer exhibits perpendicular magnetization. This is very useful for obtaining high TMR from perpendicular MTJs. It has been experimentally demonstrated that simple CoFeB/MgO/CoFeB tunnel junctions with thin perpendicular CoFeB layers show high TMR up to ~150%. However, practical perpendicular MTJs have reference layers based on a synthetic antiferromagnetic (SAF) structure (e.g., [Co-based multilayers]/Ru/[Co-based multilayers]). This is to control dipolar coupling fields between a free layer and a pinned layer and thereby obtain comparable thermal stability for each MTJ state.

Figure 1:
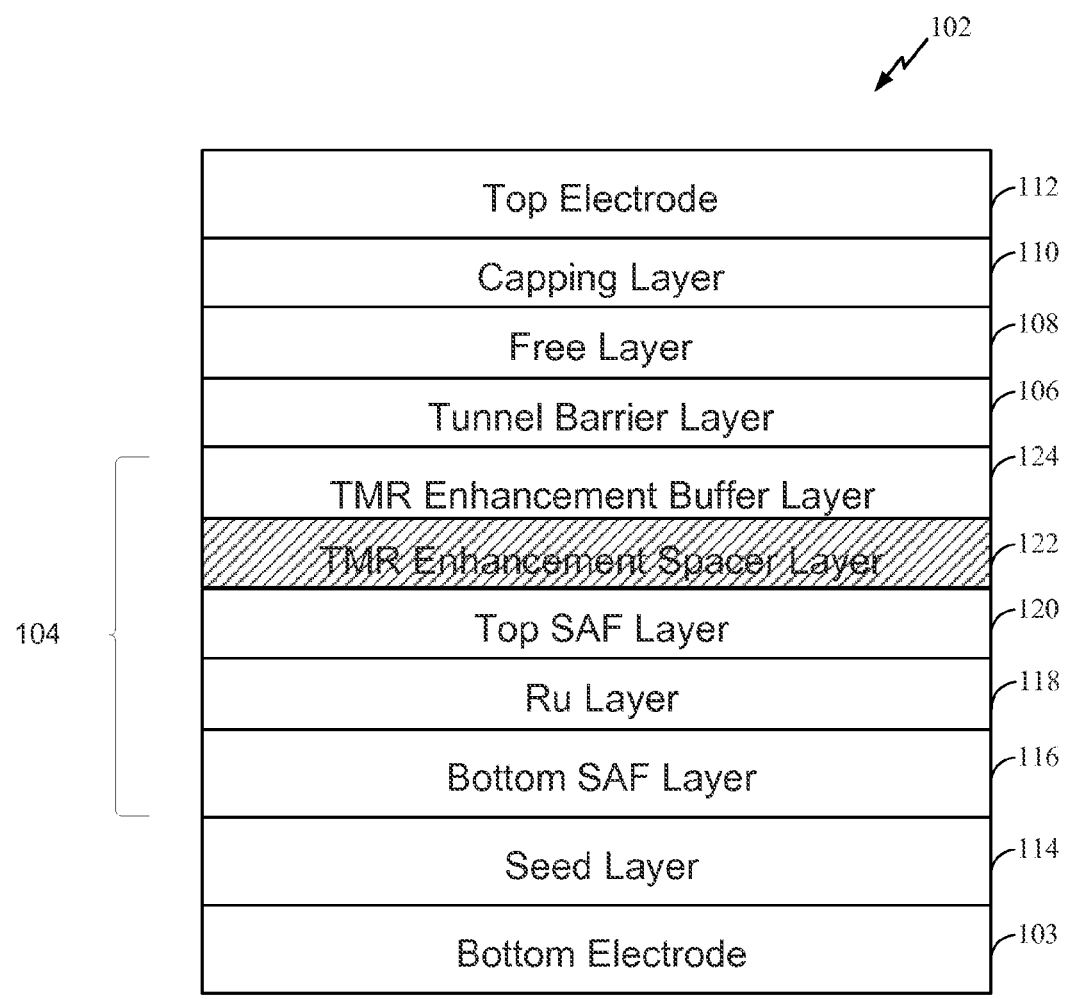
FIG. 1 is a cross-sectional diagram of a magnetic tunnel junction (MTJ) structure according to aspects of the present disclosure.

FIG. 1 is a cross-sectional diagram of an arrangement of layers of a representative magnetic tunnel junction (MU) structure 102. The MTI structure 102 includes a fixed PMA reference structure 104 and a tunnel barrier layer 106 deposited on the PMA reference structure 104. The PMA reference structure 104 is deposited on a seed layer 114 on a bottom electrode 103. The PMA reference structure 104 is based on a synthetic antiferromagnetic structure, A bottom SAF layer 116 and a top SAF layer 120 are anti-ferromagnetically coupled via a non-magnetic spacer (e.g. Ru or Ir). The tunnel barrier layer 106 may be MgO. A free layer 108 is deposited on the tunnel barrier layer 106. The free layer 108 may be a layer of PMA-CoFeB that has a thickness of less than about 20 Å, or may be a layer of PMA-FeB, for example. A capping layer 110 and a top electrode 112 are deposited over the free layer 108.

The bottom SAF layer 116, the Ru layer 118 (or Ir layer, not shown) and the top SAF layer 120 are deposited on the seed layer 114. Most perpendicular materials available for the bottom SAF layer 116 and the top SAF layer 120 do not provide a desirable template for promoting (001)-texture in MgO, For example, Co-based multilayers are typically arranged in the (111) plane of a face centered cubic (fcc) crystal structure, also referred to as fcc(111). For this reason, a tunnel magneto-resistance (TMR) enhancement buffer layer 124 is deposited between the tunnel barrier layer 106 and the top SAF layer 120 to achieve a high TMR. The TMR enhancement buffer layer 124 is generally an in-plane material, such as Fe, FeB, and CoFeB, with a body centered cubic (bcc) crystal structure in the (001) plane, also referred to as bcc(001). However, when the TMR enhancement buffer layer 124 is relatively thin, the crystal structure of the TMR enhancement buffer layer 124 is affected by the template effect from the top SAF layer 120 (e.g., fcc(111)), resulting in non-ideal textures in the TMR enhancement buffer layer 124 (e.g., bcc(011)) and thereby poor (001)-texture in MgO. Therefore, it is desirable to increase the thickness of the TMR enhancement buffer layer 124 as much as possible.

Sufficient surface anisotropy in addition to direct ferromagnetic coupling from the top SAF layer 120 can make this relatively thick TMR enhancement buffer layer 124 magnetized perpendicular to the plane. However, the increased thickness may introduce an in-plane magnetization in this layer. Because TMR is also dependent on the angle between the magnetizations of free and pinned layers, such an in-plane component in the TMR enhancement buffer layer 124 degrades TMR.

To further enhance TMR, a TMR enhancement spacer layer 122 is deposited between the TMR enhancement buffer layer 124 and the top SAF layer 120, The TMR enhancement spacer layer 122 increases TMR by blocking atomic diffusion from the top SAF layer 120 and the bottom SAF layer 116 and suppressing the template effect from the top SAF layer 120 and bottom SAF layer 116, In this sense, it is desirable to increase thickness of the TMR enhancement spacer layer 122 to increase TMR. However, this may have the undesirable effect of reducing the exchange coupling between the TMR enhancement buffer layer 124 and the top SAF layer 120, which may result in in-plane magnetization in the TMR enhancement buffer layer 124. Therefore, the TMR enhancement spacer layer 122 should be thin enough to ensure the TMR enhancement buffer layer 124 will remain fully perpendicular, but sufficiently thick to suppress the template effect as much as possible. It has been observed that a TMR enhancement spacer layer 122 may be made from tantalum with a maximum thickness of 0.3 nanometers (nm) to provide sufficient exchange coupling to allow the buffer to remain perpendicular. Increasing the thickness of a TMR enhancement spacer layer 122 made from tantalum further would make the TMR enhancement buffer layer 124 magnetized in the plane.

Figure 2:
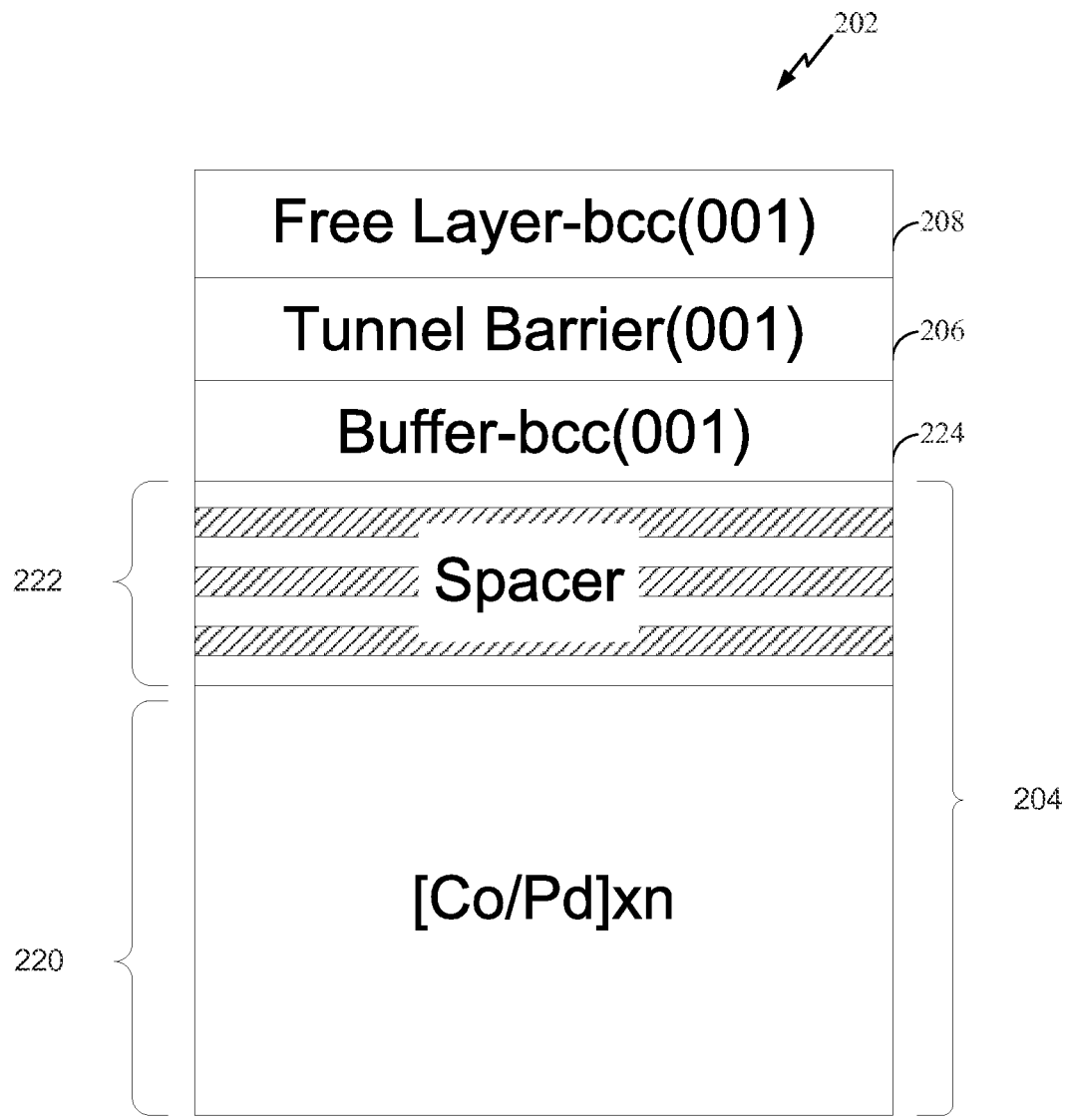
FIG. 2 is a cross-sectional diagram of a magnetic tunnel junction (MTJ) structure according to aspects of the present disclosure.

FIG. 2 is a cross-sectional diagram of an arrangement of layers of a representative magnetic tunnel junction (MTJ) structure 202 according to an aspect of the disclosure. According to this aspect, a TMR enhancement spacer layer 222 is made from a non-magnetic amorphous alloy that includes magnetic material such as Fe and Co. As long as the amount of magnetic materials is below a certain threshold, this amorphous alloy remains non-magnetic. Instead, the magnetic elements in the TMR enhancement spacer layer 222 increase exchange coupling strength. Because of the strong exchange coupling, the thickness of the TMR enhancement spacer layer 222 can be increased further to block the template effect from the fcc(111) TMR enhancement spacer layer 222 while keeping the TMR enhancement buffer layer 224 fully perpendicular. The amorphous surface is also beneficial for MgO growth and provides stronger surface anisotropy in the TMR enhancement spacer layer 224.

The MTJ structure 202 includes a fixed PMA reference structure 204 and an MgO tunnel barrier layer 206 deposited on the PMA reference structure 204. The PMA reference structure 204 includes any number (xn) of fcc(111) SAF layers 220 such as a multi-layer combination of Co and Pd, for example. A free layer 208 is deposited on the tunnel barrier layer 206. The free layer 208 may be a layer of PMA-CoFeB, for example.

A CoFeB TMR enhancement buffer layer 224 with a bcc (001) structure is deposited between the tunnel barrier layer 206 and the SAF layers 220 to achieve a high TMR. According to an aspect of the disclosure the TMR enhancement spacer layer 222 is between about 4 angstroms and 20 angstroms thick and made from an amorphous alloy including a magnetic material such as Fe or Co, for example. Exemplary alloys for providing a TMR enhancement buffer layer 224 include Fe/Ta, Co/Ta, FeB/Ta, Fe/TaN or FeB/TaN. In a particular example, the TMR enhancement spacer layer 222 is made from a 0.14 nm Ta/0.2 nm Fe/0.14 nm Ta layer by layer deposition, which forms an amorphous alloy. Stronger exchange coupling can be achieved when the spacer is deposited from a single alloy target. This allows the thickness of the TMR enhancement spacer layer 222 to be increased further, which may provide more room to improve the thickness of the TMR enhancement buffer layer 224, An aspect of the present disclosure includes a perpendicular MTJ apparatus including means for increasing exchange coupling to a TMR enhancement buffer layer 224. The means for increasing exchange coupling includes an amorphous alloy layer adjacent to the TMR enhancement buffer layer 224. Such means may be provided by the TMR enhancement spacer layer 222 as shown in FIG. 2, for example.

Figure 3:
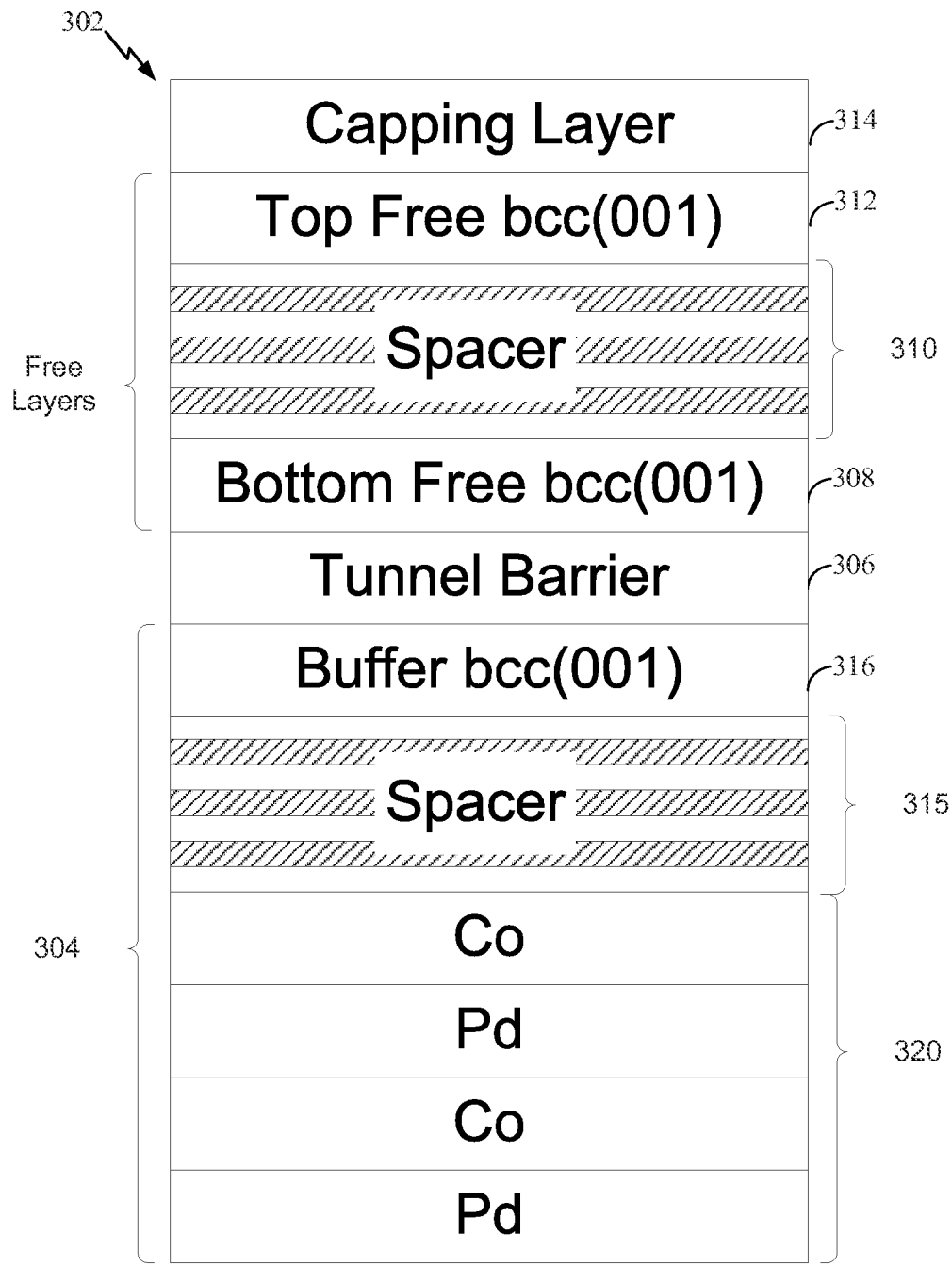
FIG. 3 is a cross-sectional diagram of a magnetic tunnel junction (MTJ) structure according to aspects of the present disclosure.

FIG. 3 is a cross-sectional diagram of an arrangement of layers of a representative magnetic tunnel junction (MTJ) structure 302 according to another aspect of the disclosure. The MTJ structure 302 includes a fixed PMA reference structure 304 and an MgO tunnel barrier layer 306 deposited on the PMA reference structure 304. The PMA reference structure 304 may include fcc(111) SAF layers 320, such as a multi-layer combination of Co and Pd, for example. As discussed above, the PMA reference structure 304 can also include a spacer 315 and a buffer layer 316.

According to this aspect of the disclosure, a bottom free layer 308 is deposited on the tunnel barrier layer 306. A PMA enhancement spacer 310 made from an amorphous alloy is deposited on the bottom free layer 308. A top free layer 312 is deposited on the PMA enhancement spacer 310. An insulating capping layer 314 is deposited on the top free layer 312. The bottom free layer 308 and the top free layer 312 may each be a layer of PMA-CoFeB with a bcc(001) crystal structure, for example. The insulating capping layer 314 may be an oxide layer of MgO, AlOx, or $HfO_2$, for example, which protects the top free layer 312, the PMA enhancement spacer 310 and the bottom free layer 308.

The PMA enhancement spacer 310 can be made from an amorphous alloy including a magnetic material such as Fe or Co, for example. Exemplary alloys for providing a PMA enhancement spacer 310 include Fe/Ta, Co/Ta, FeB/Ta, Fe/TaN or FeB/TaN. In a particular example, the PMA enhancement spacer 310 is made from a 0.14 nm Ta/0.2 nm Fe/0.14 nm Ta layer by layer deposition, which forms an amorphous alloy.

The use of the PMA enhancement spacer 310 also reduces magnetic dead layer thickness of the free layer. By making this layer from an amorphous alloy according to aspects of the present disclosure, the top free layer 312 and the bottom free layer 308 are strongly coupled. This allows free layers with increased effective thickness and enhances thermal stability of the MTJ structure 302.

An aspect of the present disclosure includes a perpendicular MTJ apparatus including means for increasing surface anisotropy between a top flee layer and a bottom free layer. The means for increasing surface anisotropy can be a second amorphous alloy later between the top free layer and the bottom free layer. Such means may be provided by the PMA enhancement spacer layer 310 as shown in FIG. 3, for example.

Figure 4:
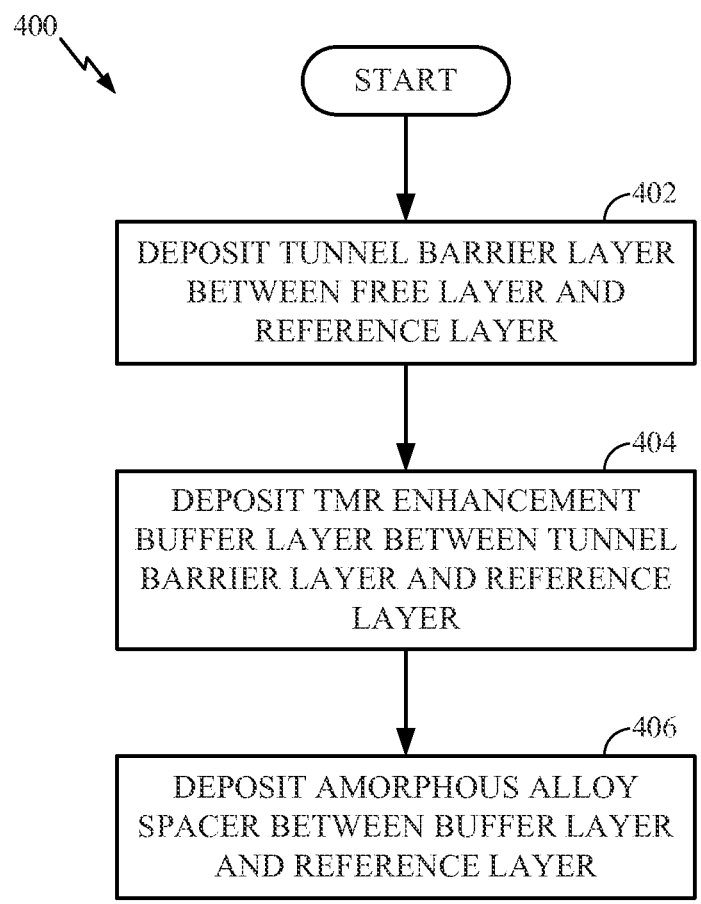
FIG. 4 is a process flow diagram illustrating a method of constructing a perpendicular magnetic tunnel junction (MTJ) apparatus according to an aspect of the present disclosure.

FIG. 4 is a process flow diagram illustrating a method of constructing a perpendicular magnetic tunnel junction (MTJ) apparatus according to an aspect of the present disclosure. It should be noted that the following description does not reflect the actual sequence of film growth. The method 400 includes depositing a tunnel barrier layer between a free layer and a reference layer in block 402, and depositing a tunnel magnetoresistance (TMR) enhancement buffer layer between the tunnel barrier layer and the reference layer in block 404. The method also includes depositing an amorphous alloy TMR enhancement spacer between the TMR enhancement buffer layer and the reference layer in block 406.

Figure 5:
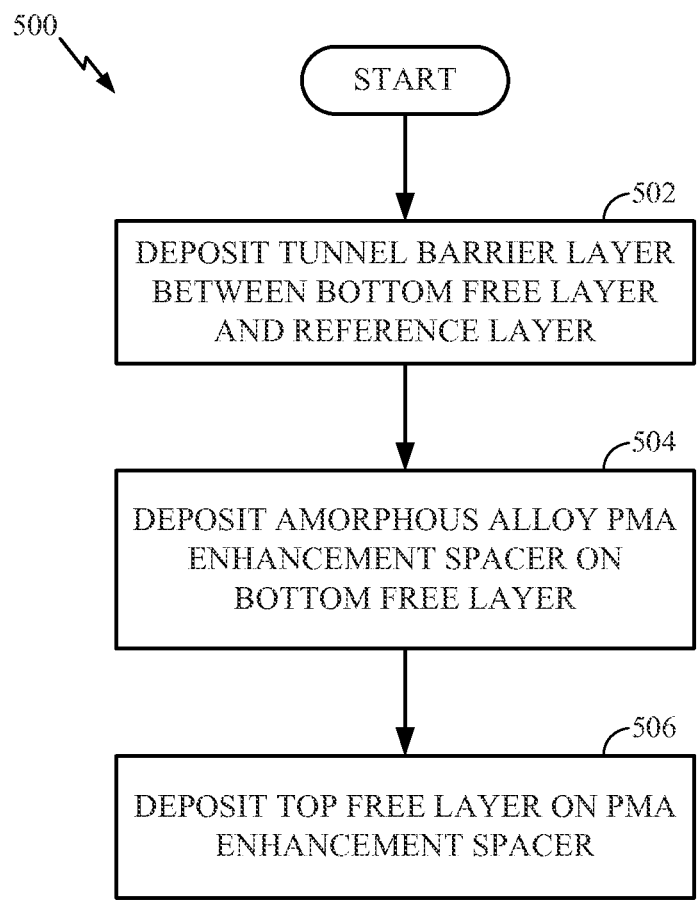
FIG. 5 is a process flow diagram illustrating an exemplary method of constructing a perpendicular magnetic tunnel junction (MTJ) structure according to aspects of the present disclosure.

FIG. 5 is a process flow diagram illustrating a method of constructing a perpendicular magnetic tunnel junction (MTJ) apparatus according to another aspect of the present disclosure. The method 500 includes depositing a tunnel barrier layer between a bottom free layer and a reference layer in block 502, depositing an amorphous alloy perpendicular magnetic anisotropy (PMA) enhancement spacer on the bottom free layer in block 504, and depositing a top free layer on the PMA enhancement spacer in block 506.

Figure 6:
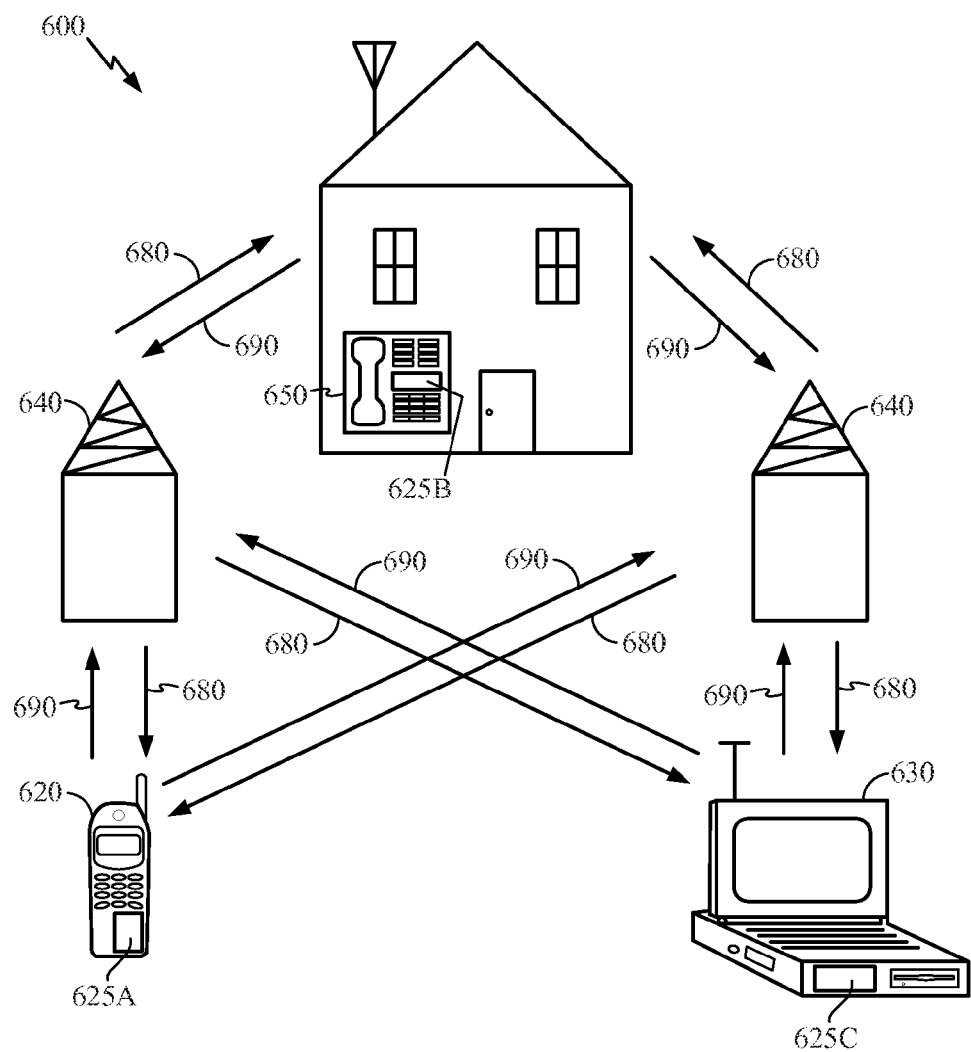
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 6253 that include the disclosed MRAM. It will be recognized that other devices may also include the disclosed MRAM, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 6 illustrates remote units according to the teachings of the disclosure, the disclosure is not limited to these exemplary illustrated units. Aspects of the disclosure may be suitably employed in many devices, which include MRAM.

Figure 7:
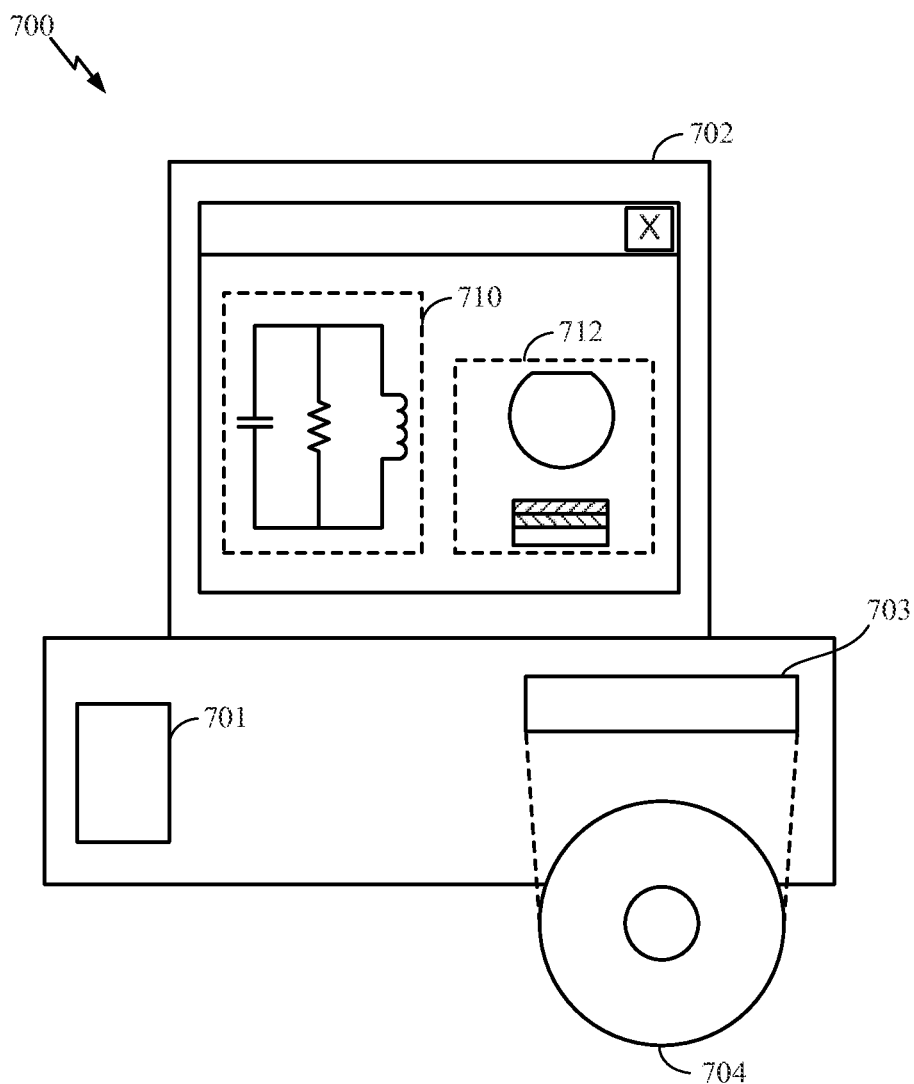
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the MRAM disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as an MRAM. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein, For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data. magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A perpendicular magnetic tunnel junction (MTJ) apparatus comprising:
   a tunnel barrier layer deposited between a free layer and a reference layer;
   a tunnel magnetoresistance (TMR) enhancement buffer layer deposited between the tunnel barrier layer and the reference layer, the TMR enhancement buffer layer comprising a bcc (001) structure; and
   a non-magnetic amorphous superlattice TMR enhancement spacer deposited between the TMR enhancement buffer layer and the reference layer, in which the non-magnetic amorphous superlattice TMR enhancement spacer is arranged to block a template effect from a synthetic antiferromagnetic (SAF) layer and in which a center layer of the superlattice TMR enhancement spacer is thicker than outer layers of the superlattice TMR enhancement spacer.

2. The apparatus of claim 1 in which the non-magnetic amorphous superlattice TMR enhancement spacer comprises:
   a superlattice of Fe/Ta, Co/Ta, FeB/Ta, Fe/TaN and/or FeB/TaN.

3. The apparatus of claim 1 in which the non-magnetic TMR enhancement spacer is between about 4 Å and about 20 Å thick.

4. The apparatus of claim 1 integrated into a mobile phone, a set top box, a music player, a video player, an entertainment unit, a navigation device, a computer, a hand-held personal communication systems (PCS) unit, a portable data unit, and/or a fixed location data unit.

5. A method for constructing a perpendicular magnetic tunnel junction (MTJ) apparatus, comprising:
   depositing a tunnel barrier layer between a free layer and a reference layer;
   depositing a tunnel magnetoresistance (TMR) enhancement buffer layer between the tunnel barrier layer and the reference layer, the TMR enhancement buffer layer comprising a bcc (001) structure; and
   depositing a non-magnetic amorphous superlattice TMR enhancement spacer between the TMR enhancement buffer layer and the reference layer, in which a thickness of the non-magnetic amorphous superlattice TMR enhancement spacer is selected to block a template effect from a synthetic antiferromagnetic (SAF) layer and in which a center layer of the of the superlattice TMR enhancement spacer is thicker than outer layers of the superlattice TMR enhancement spacer.

6. The method of claim 5, further comprising:
   depositing a superlattice of Fe/Ta, Co/Ta, FeB/Ta, Fe/Tan and/or FeB/Tan between the TMR enhancement buffer layer and the reference layer.

7. The method of claim 5, further comprising:
   depositing the non-magnetic amorphous TMR enhancement spacer with a thickness of 4 Å about 20 Å.

8. The method of claim 5, further comprising integrating the perpendicular MTJ apparatus into a mobile phone, a set top box, a music player, a video player, an entertainment unit, a navigation device, a computer, a hand-held personal communication systems (PCS) unit, a portable data unit, and/or a fixed location data unit.

9. A method for constructing a perpendicular magnetic tunnel junction (MTJ) apparatus, comprising steps of:
   depositing a tunnel barrier layer between a free layer and a reference layer;
   depositing a tunnel magnetoresistance (TMR) enhancement buffer layer between the tunnel barrier layer and the reference layer, the TMR enhancement buffer layer comprising a bcc (001) structure; and
   depositing a non-magnetic amorphous superlattice TMR enhancement spacer between the TMR enhancement buffer layer and the reference layer, in which a thickness of the superlattice TMR enhancement spacer is selected to block a template effect from a synthetic antiferromagnetic (SAF) layer and in which a center layer of the of the superlattice TMR enhancement spacer is thicker than outer layers of the superlattice TMR enhancement spacer.

10. The method of claim 9, further comprising the step of integrating the perpendicular MTJ apparatus into a mobile phone, a set top box, a music player, a video player, an entertainment unit, a navigation device, a computer, a hand-held personal communication systems (PCS) unit, a portable data unit, and/or a fixed location data unit.

* * * * *